(12) United States Patent
Cheon

(10) Patent No.: US 9,258,912 B2
(45) Date of Patent: Feb. 9, 2016

(54) DISPLAY DEVICE

(71) Applicant: Samsung Display Co., Ltd., Yongin, Gyeonggi-do (KR)

(72) Inventor: Kyu-Hyeong Cheon, Seongnam-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/567,861

(22) Filed: Dec. 11, 2014

(65) Prior Publication Data

US 2015/0092367 A1  Apr. 2, 2015

Related U.S. Application Data

(62) Division of application No. 13/476,939, filed on May 21, 2012, now Pat. No. 8,934,227.

(30) Foreign Application Priority Data

Jun. 29, 2011 (KR) .................. 10-2011-0063953

(51) Int. Cl.
*G06F 1/16* (2006.01)
*H05K 5/00* (2006.01)
(Continued)

(52) U.S. Cl.
CPC ............ *H05K 5/0217* (2013.01); *H05K 5/0017* (2013.01); *H05K 5/02* (2013.01);
(Continued)

(58) Field of Classification Search
CPC .. H05K 7/20218–7/20381; H05K 5/00–5/069; H05K 7/00–7/186; H01L 23/473; G06F 1/161–1/1626; G06F 2200/202–2200/203; G06F 1/181–1/182; G06F 1/1601–1/1611; G06F 1/1613–1/1698; G06F 1/18–1/189

USPC .............. 361/679.21–679.25, 679.26–679.3, 361/807–810, 679.55–679.56, 679.4, 361/679.01; 349/56–60, 905; 455/575.1–575.9; 348/787–794; 248/917; 312/223.1–223.2
See application file for complete search history.

(56) References Cited

U.S. PATENT DOCUMENTS 6,504,587 B1   1/2003 Morishita et al.
6,611,302 B1 * 8/2003 Ueda ................. G02F 1/133308
                                                          349/58

(Continued)

FOREIGN PATENT DOCUMENTS

CN   102074163 A   5/2011
EP   2 322 975 A2  5/2011

(Continued)

OTHER PUBLICATIONS

Chinese Office Action dated May 20, 2015 for Chinese Patent Application No. CN 201210157461.0 which shares priority of Korean Patent Application No. KR 10-2011-0063953 with captioned U.S. Appl. No. 14/567,861, and cites the above-identified references numbered 1, 3, 4, and 5.

*Primary Examiner* — Anthony Haughton
*Assistant Examiner* — Razmeen Gafur
(74) *Attorney, Agent, or Firm* — Knobbe, Martens, Olson & Bear, LLP

(57) ABSTRACT

A display device is disclosed. In one embodiment, the display device includes a display panel, a housing which houses the display panel and a frame which is disposed under the housing and comprises a first bottom portion. The first bottom portion includes a first bottom surface which is an upper surface thereof and a first base surface which is a lower surface thereof, and the frame includes a groove recessed from the first bottom surface.

9 Claims, 12 Drawing Sheets

(51) Int. Cl.
  *H05K 5/02* (2006.01)
  *H05K 7/14* (2006.01)
  *H05K 7/00* (2006.01)
  *G02F 1/1333* (2006.01)

(52) U.S. Cl.
  CPC ......... *H05K 7/1427* (2013.01); *G02F 1/13338* (2013.01); *G02F 2001/133314* (2013.01); *G02F 2201/503* (2013.01); *Y10S 345/905* (2013.01)

(56) References Cited

U.S. PATENT DOCUMENTS

| | | | | |
|---|---|---|---|---|
| 6,741,299 B2* | 5/2004 | Fukayama | ........ | G02F 1/133308 349/58 |
| 7,130,187 B1* | 10/2006 | Sun | ......... | G06F 1/184 206/320 |
| 7,230,659 B2* | 6/2007 | Ha | ......... | G02F 1/133308 349/58 |
| 7,787,071 B2 | 8/2010 | Nishio et al. | | |
| 7,826,206 B2* | 11/2010 | Woo | ......... | G02F 1/133308 349/60 |
| 8,027,163 B2* | 9/2011 | Bang | ......... | H05K 7/20963 345/905 |
| 8,194,207 B2 | 6/2012 | Kim et al. | | |
| 8,325,290 B2 | 12/2012 | Bae et al. | | |
| 8,436,958 B2 | 5/2013 | Lee et al. | | |
| 8,477,254 B2* | 7/2013 | Kujiraoka | ......... | G02B 6/0091 348/794 |
| 8,649,162 B2* | 2/2014 | Jang | ......... | G02F 1/133608 361/679.02 |
| 8,665,586 B2* | 3/2014 | Lai | ......... | G06F 1/1656 349/58 |
| 8,670,085 B2 | 3/2014 | Jean et al. | | |
| 8,704,974 B2* | 4/2014 | Noh | ......... | G02B 6/0085 349/58 |
| 8,792,252 B2* | 7/2014 | Hwang | ......... | G02F 1/133308 349/58 |
| 2001/0019377 A1* | 9/2001 | Fukayama | ........ | G02F 1/133308 349/58 |
| 2002/0060762 A1 | 5/2002 | Arakawa | | |
| 2002/0180661 A1 | 12/2002 | An | | |
| 2003/0063230 A1 | 4/2003 | Kato et al. | | |
| 2004/0246397 A1* | 12/2004 | Kang | ........ | G02F 1/133308 349/58 |
| 2005/0105259 A1 | 5/2005 | Lee et al. | | |
| 2005/0185111 A1* | 8/2005 | Matsuoka | ......... | G02F 1/133308 349/58 |
| 2006/0158837 A1* | 7/2006 | Kim | ......... | H01J 11/10 361/679.27 |
| 2007/0002206 A1 | 1/2007 | Shirai | | |
| 2007/0139872 A1 | 6/2007 | Lee et al. | | |
| 2007/0222912 A1 | 9/2007 | Sato et al. | | |
| 2008/0266483 A1 | 10/2008 | Kim | | |
| 2009/0122218 A1* | 5/2009 | Oh | ......... | G02F 1/133385 361/679.21 |
| 2009/0167171 A1 | 7/2009 | Jung et al. | | |
| 2009/0174996 A1* | 7/2009 | Park | ......... | H05K 5/0017 361/679.21 |
| 2009/0207560 A1* | 8/2009 | Lee | ......... | H01L 51/5237 361/679.01 |
| 2009/0225507 A1* | 9/2009 | Sato | ................... | H05K 7/20963 361/679.21 |
| 2009/0237586 A1* | 9/2009 | Han | ......... | G02F 1/133308 349/58 |
| 2010/0039766 A1* | 2/2010 | Chiang | ......... | G11B 33/08 361/679.34 |
| 2010/0157193 A1 | 6/2010 | Park et al. | | |
| 2010/0171898 A1 | 7/2010 | Lee | | |
| 2010/0321594 A1 | 12/2010 | Takata | | |
| 2011/0128463 A1* | 6/2011 | Ji | ......... | G02F 1/133308 349/58 |
| 2011/0134599 A1* | 6/2011 | Li | ......... | G06F 1/187 361/679.34 |
| 2011/0188201 A1* | 8/2011 | Lin | ......... | H05K 7/20 361/695 |
| 2011/0261283 A1* | 10/2011 | Kim | ......... | H04N 5/2257 349/58 |
| 2011/0299236 A1* | 12/2011 | Sun | ......... | G06F 1/187 361/679.36 |

FOREIGN PATENT DOCUMENTS

| | | |
|---|---|---|
| JP | 2007-232802 A | 9/2007 |
| JP | 2010-210891 A | 9/2010 |
| KR | 10-2007-0029007 A | 3/2007 |
| KR | 10-2008-0022991 A | 3/2008 |
| KR | 10-0922357 B1 | 10/2009 |
| KR | 10-2011-0004398 A | 1/2011 |

* cited by examiner

DISPLAY DEVICE

This application is a divisional application of U.S. patent application Ser. No. 13/476,939, filed May 21, 2012, and claims priority from Korean Patent Application No. 10-2011-0063953 filed on Jun. 29, 2011 in the Korean Intellectual Property Office, the disclosure of which is incorporated herein by reference in its entirety.

BACKGROUND

1. Field

The described technology generally relates to a display device including a display panel and a housing and a frame which house the display panel.

2. Description of the Related Technology

Display devices are applied to televisions, monitors, notebooks, mobile phones, smart phones, tablet PCs, and the like to display images. Examples of display panel technologies include liquid crystal displays (LCDs), organic light-emitting diodes (OLEDs) and plasma display panels (PDPs). LCDs, OLEDs and PDPs are distinguished by the way they emit light.

A display device includes a display panel which displays an image and a housing which houses the display panel. The housing is accommodated in a frame. The frame is made of, e.g., metal to protect the display panel against external impact. Some display devices include a touch panel or a switching panel on the display panel to be used as three-dimensional (3D) displays. An external panel such as a touch panel or a switching panel may be housed in the housing and/or the frame, together with the display panel.

When an external impact is applied to the frame accommodating the display panel, the panel may be damaged.

SUMMARY

One inventive aspect is a display device structured to prevent a display panel from being damaged by external impact.

Another aspect is a display device comprising: a display panel, a housing which houses the display panel and a frame which is disposed under the housing and comprises a first bottom portion, wherein the first bottom portion comprises a first bottom surface which is an upper surface thereof and a first base surface which is a lower surface thereof, and the frame comprises a groove recessed from the first bottom surface.

Another aspect is a display device comprising: a display panel, a housing which houses the display panel and a frame which is disposed under the housing and comprises a bottom portion having one or more through holes.

DETAILED DESCRIPTION

Embodiments will now be described more fully hereinafter with reference to the accompanying drawings. The same reference numbers indicate the same components throughout the specification. In the attached figures, the thickness of layers and regions is exaggerated for clarity.

Unless defined otherwise, all technical and scientific terms used herein have the same meaning as commonly understood by one of ordinary skill in the art relating to the disclosed embodiments. It is noted that the use of any and all examples, or exemplary terms provided herein is intended merely to better illuminate embodiments, and thus, it is not considered limiting.

Figure 1:
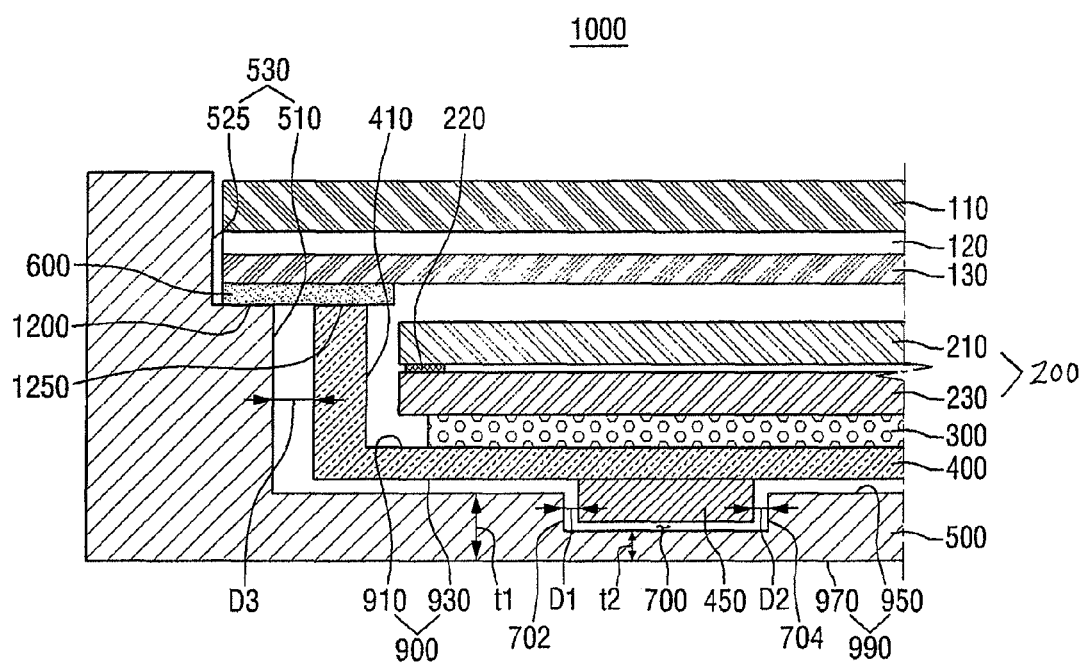
FIG. 1 is a cross-sectional view of an organic light-emitting display device according to an embodiment.

FIG. 1 is a cross-sectional view of an organic light-emitting display device 1000 according to an embodiment.

Referring to FIG. 1, the organic light-emitting display device 1000 includes a display panel 200, a housing 400 which houses the display panel 200, and a frame 500 which is disposed under the housing 400.

The display panel 200 may include first and second plates 230 and 210 which face each other and an organic light-emitting element which is interposed between the first plate 230 and the second plate 210. At least one of the first and second plates 230 and 210 may be made of a transparent material, such as glass or transparent polymer resin.

A plurality of micro elements (not shown) for light emission may be situated on the first plate 230. The micro elements may include, for example, a plurality of metal wirings, a plurality of thin-film transistors (TFTs), and a plurality of metal electrodes. The metal electrodes may include a cathode electrode and an anode electrode. The above organic light-emitting element may be situated between the anode electrode and the cathode electrode. The organic light-emitting element includes an organic light-emitting layer. The anode electrode is connected to at least one TFT so as to receive a pixel voltage. A common voltage is applied to the cathode electrode.

Holes injected from the anode electrode and electrons injected from the cathode electrode combine together in the organic light-emitting layer to form excitons. The organic light-emitting element emits light due to energy generated when the excitons transit from an excited state to a ground state.

The second plate 210 faces the first plate 230 and covers the organic light-emitting element disposed on the first plate 230. The space between the first and second plates 230 and 210 may be sealed with a frit 220.

The housing 400 houses the display panel 200. The housing 400 may include a bottom portion 900 and a sidewall 410 extending upward from the bottom portion 900. In FIG. 1, the sidewall 410 extends upward from the bottom portion 900 in a direction substantially perpendicular to the bottom portion 900. The bottom portion 900 includes a bottom surface 910 which is an upper surface thereof and a base surface 930 which is a lower surface thereof. The bottom surface 910 is a surface that actually accommodates the display panel 200. The sidewall 410 limits the range in which the display panel 200 can move in a substantially horizontal direction.

The housing 400 may be made of metal such as aluminum, stainless steel, or steel, electrogalvanized, cold rolled coil (SECC). The above listed materials not only give the housing 400 a certain degree of mechanical strength but also are advantageous in dissipating heat emitted from the display panel 200 to the outside due to their high thermal conductivity. However, the material that forms the housing 400 is not limited to the above materials.

The frame 500 is disposed under the housing 400. The frame 500 may include a bottom portion 990 and a sidewall 530 extending upward from the bottom portion 990. A direction in which the sidewall 410 of the housing 400 extends may be substantially the same as a direction in which the sidewall 530 of the frame 500 extends. The sidewall 410 of the housing 400 and the sidewall 530 of the frame 500 may not be closely attached to each other. When the direction in which the sidewall 410 of the housing 400 extends is substantially the same as the direction in which a first sidewall 510 of the frame 500 extends, the sidewall 410 of the housing 400 and the first sidewall 510 of the frame 500 may be arranged substantially parallel to each other. Thus, the gap between the sidewall 410 of the housing 400 and the first sidewall 510 of the frame 500 may remain substantially constant regardless of position. The bottom portion 990 includes a lower surface and an upper surface. The lower surface of the bottom portion 990 is referred to as a base surface 970. The upper surface of the bottom portion 990 includes a bottom surface 950 and a groove 700 recessed from the bottom surface 950.

A predetermined gap exists between the base surface 970 and the bottom surface 950. The predetermined gap corresponds to a first thickness t1 of the bottom portion 990. In the embodiment of FIG. 1, the base surface 970 forms a substantially flat surface regardless of a region in which the groove 700 is formed. Since the region in which the groove 700 is formed is recessed from the bottom surface 950, a second thickness t2 between a bottom surface of the groove 700 and the base surface 970 is smaller than the first thickness t1. The base surface 970 may protrude downward along the recessed shape of the region in which the groove 700 is formed. In this case, the second thickness t2 between the bottom surface of the groove 700 and the base surface 970 may be substantially equal to or greater than the first thickness t1.

Figure 13:
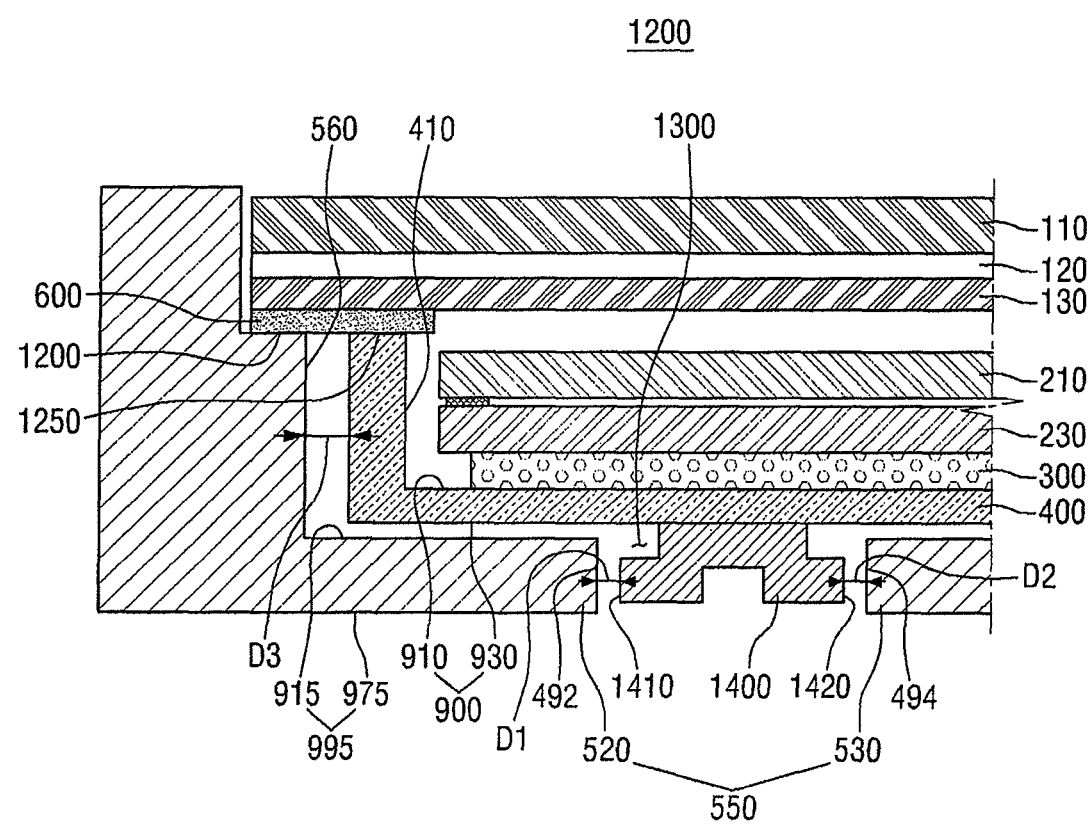

The second thickness t2 between the bottom surface of the groove 700 and the base surface 970 may be substantially zero. When the second thickness t2 is substantially zero, the bottom surface of the groove 700 is not covered with the base surface 970 of the frame 500 but is substantially completely open. This embodiment is illustrated in FIG. 13, which will be described in detail later.

When the housing 400 is placed on the bottom surface 950 of the frame 500, a housing space is defined between the base surface 930 of the housing 400 and the groove 700 of the frame 500. An impact relieving member 450 may be placed in the housing space.

The impact relieving member 450 may be at least partially attached to the base surface 930 of the housing 400. At the same time, the impact relieving member 450 may be at least partially inserted into the space within the groove 700 of the frame 500. The impact relieving member 450 may be a polyhedral or polygonal plate. As shown in FIG. 1, the impact relieving member 450 may be shaped like, e.g., a hexahedron whose cross section is rectangular. Although not shown in the drawing, the impact relieving member 450 may also be spherical. That is, the impact relieving member 450 can have various shapes.

In the embodiment of FIG. 1, a cross section of the groove 700 includes three substantially rectangular sides. The cross section of the groove 700 can also have various shapes such as a polygon and a sphere. The cross section of the groove 700 may also have a shape corresponding to the shape of the cross section of the impact relieving member 450, for example, may have substantially the same cross-sectional profile as that of the impact relieving member 450.

The impact relieving member 450 may be made of a metal plate, for example, stainless steel. In this case, the impact relieving member 450 may be attached to the base surface 930 of the housing 400 by laser welding. An alternative to the material that forms the impact relieving member 450 may be a plastic plate. In this case, the impact relieving member 450 may be attached to the base surface 930 of the housing 400 by insert molding.

The impact relieving member 450 may be separated from inner sidewalls 702 and 704 of the groove 700 by a predetermined gap. A first shortest horizontal gap D1 or D2 between the inner sidewalls 702 and 704 of the groove 700 and the impact relieving member 450 may be smaller than a second shortest horizontal gap D3 between the first sidewall 510 of the frame 500 and the sidewall 410 of the housing 400. If the first shortest horizontal gap D1 or D2 is smaller than the second shortest horizontal gap D3, even when the frame 500 is moved in the horizontal direction by the force of external impact, the inner sidewall 702 of the groove 700 of the frame 500 catches on the impact relieving member 450 before the first sidewall 510 of the frame 500 reaches the sidewall 410 of the housing 400. Accordingly, the further movement of the frame 500 is prevented or at least suppressed. Since the direct delivery of impact from the first sidewall 510 of the frame 500 to the sidewall 410 of the housing 400 is prevented or at least suppressed, the damage to the display panel 200 housed in the housing 400 can be prevented.

Figure 2:
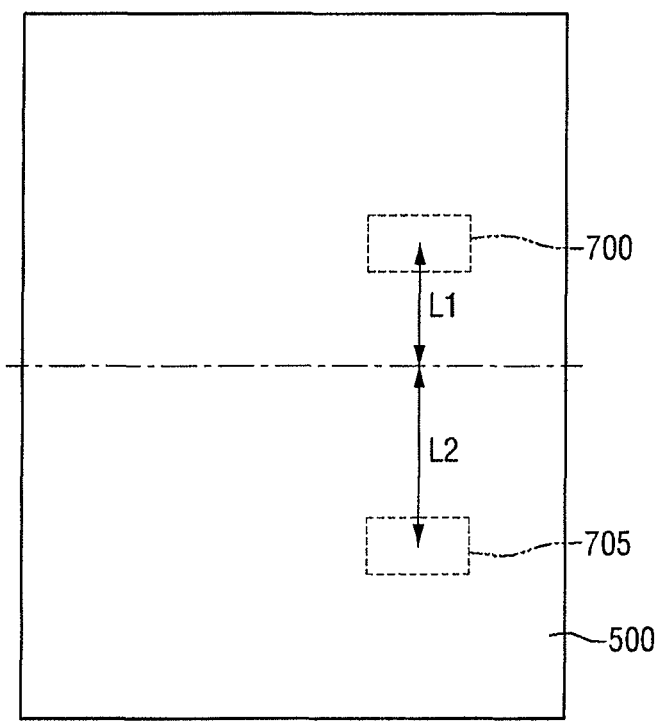
FIG. 2 is a bottom view of the organic light-emitting display device according to the embodiment of FIG. 1.

FIG. 2 is a bottom view of the organic light-emitting display device 1000 according to the embodiment of FIG. 1.

Referring to FIG. 2, a plurality of grooves may be provided in the frame 500. In this case, an equal number of impact relieving members to the number of grooves may be provided, and the impact relieving members may be inserted into the grooves, respectively. At least two grooves 700 and 705 may be arranged asymmetrical to each other with respect to a center line of the frame 500. In the embodiment of FIG. 2, the grooves 700 and 705 of the same shape are located at different distances from the center line.

Since the impact relieving member 450 attached to the housing 400 is inserted into each of the grooves 700 and 705, the housing 400 and the frame 500 may be aligned with each other based on positions of the grooves 700 and 705 in the process of assembling the housing 400 and the frame 500. If the grooves 700 and 705 are arranged asymmetrical to each other as described above, the alignment direction and margin of the frame 500 and the housing 400 are determined, thus facilitating an alignment process.

Figure 3:
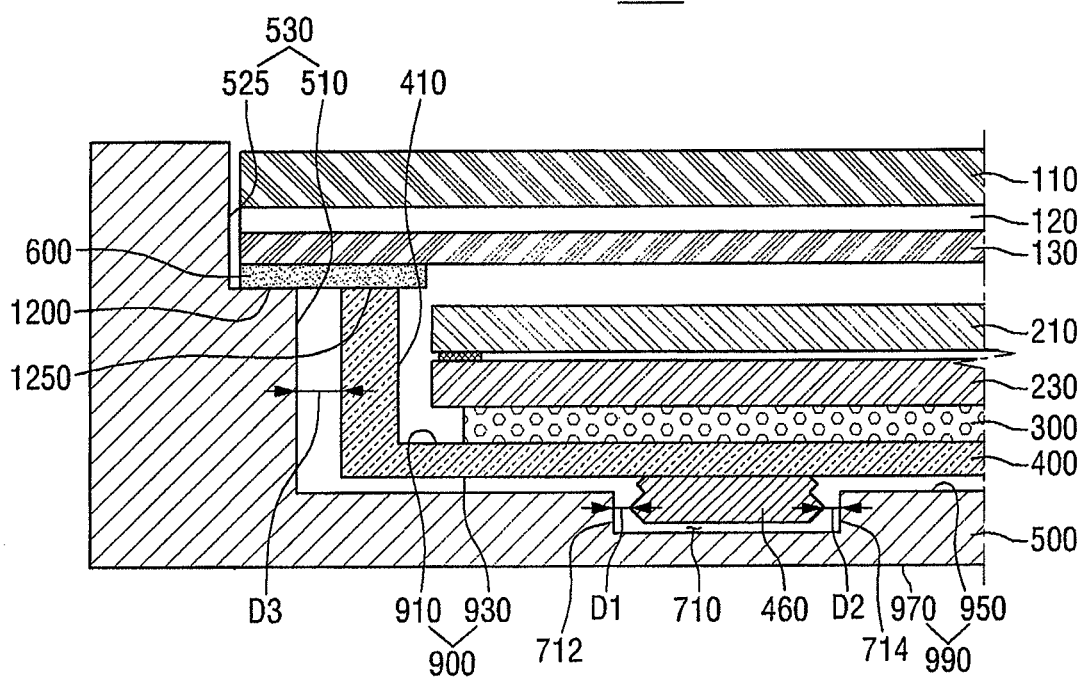
FIG. 3 is a cross-sectional view of an organic light-emitting display device according to another embodiment.

FIG. 3 is a cross-sectional view of an organic light-emitting display device 1010 according to another embodiment.

Referring to FIG. 3, the organic light-emitting display device 1010 according to the current embodiment is different from the organic light-emitting display device 1000 according to the FIG. 2 embodiment in that a cross section of an impact relieving member 460 is polygonal. As described above, the shape of the impact relieving member 460 is not limited to the shape and form illustrated in the drawing. The impact relieving member 460 can have any shape and form as long as it can perform an impact relieving function.

When the impact relieving member 460 has uneven portions as shown in the drawing, a shortest horizontal distance between inner sidewalls 712 and 714 of a groove 710 and the uneven portions of the impact relieving member 460 is a first shortest horizontal gap D1 or D2 between the inner sidewalls 712 and 714 of the groove 710 and the impact relieving member 460.

The first shortest horizontal gap D1 or D2 between the inner sidewalls 712 and 714 of the groove 710 and the impact relieving member 460 may be smaller than a second shortest horizontal gap D3 between a sidewall 510 of a frame 500 and a sidewall 410 of a housing 400. If the first shortest horizontal gap D1 or D2 is smaller than the second shortest horizontal gap D3, even when the frame 500 is moved in a substantially horizontal direction by the force of external impact, the inner sidewall 712 of the groove 710 of the frame 500 catches on the impact relieving member 460 before the sidewall 510 of the frame 500 reaches the sidewall 410 of the housing 400. Accordingly, the further movement of the frame 500 is prevented or at least suppressed.

FIGS. 4 through 9 are bottom views of organic light-emitting display devices 1040 through 1090 according to various embodiments.

Figure 4:
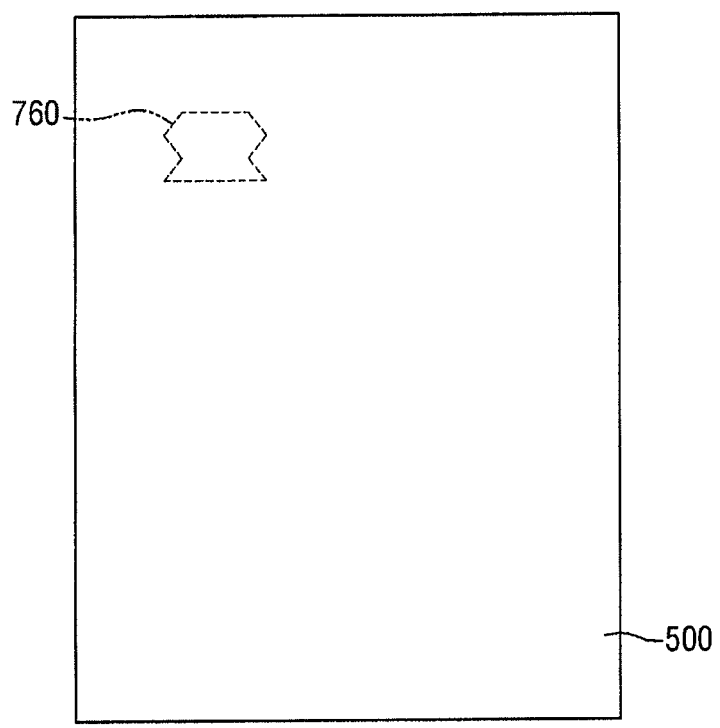
FIGS. 4 through 9 are bottom views of organic light-emitting display devices according to various embodiments.

Referring to FIG. 4, the organic light-emitting display device 1040 includes a single groove 760. The single groove 760 may be formed near an upper left corner of a frame 500. The single groove 760 may be octagonal, and its planar shape may be asymmetrical. In the embodiment of FIG. 4, the single groove 760 is located not in the center of the frame 500 but in a peripheral region of the frame 500, and its planar shape is asymmetrical. Accordingly, the alignment direction and margin of the frame 500 and a housing are determined, thus facilitating an alignment process.

Figure 5:
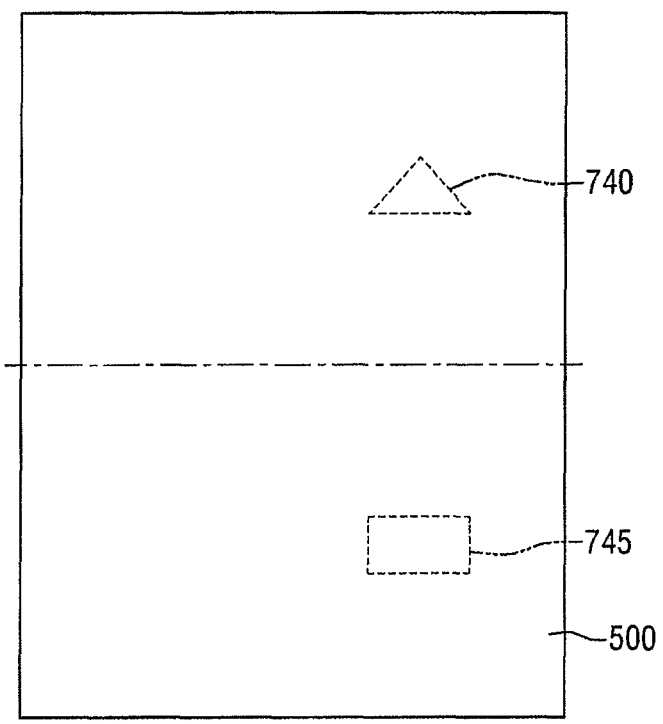

Referring to FIG. 5, the organic light-emitting display device 1050 includes two grooves 740 and 745. The grooves 740 and 745 are located at an equal distance from a center line but have different shapes. In this structure, the grooves 740 and 745 are arranged substantially asymmetrical to each other. Accordingly, the alignment direction and margin of a frame 500 and a housing are determined, thus facilitating an alignment process.

Figure 6:
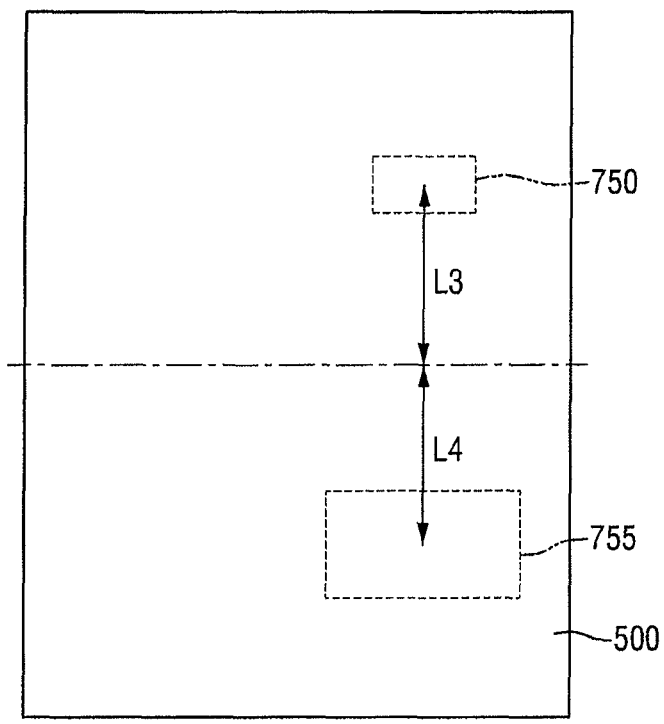

Referring to FIG. 6, the organic light-emitting display device 1060 includes two grooves 750 and 755 located at different distances L3 and L4 from a center line. Both of the two grooves 750 and 755 are rectangular. However, the groove 750 located above the center line of a frame 500 is smaller than the groove 755 located under the center line of the frame 500. In this structure, the grooves 750 and 755 are arranged substantially asymmetrical to each other. Accordingly, the alignment direction and margin of the frame 500 and a housing are determined, thus facilitating an alignment process.

Figure 7:
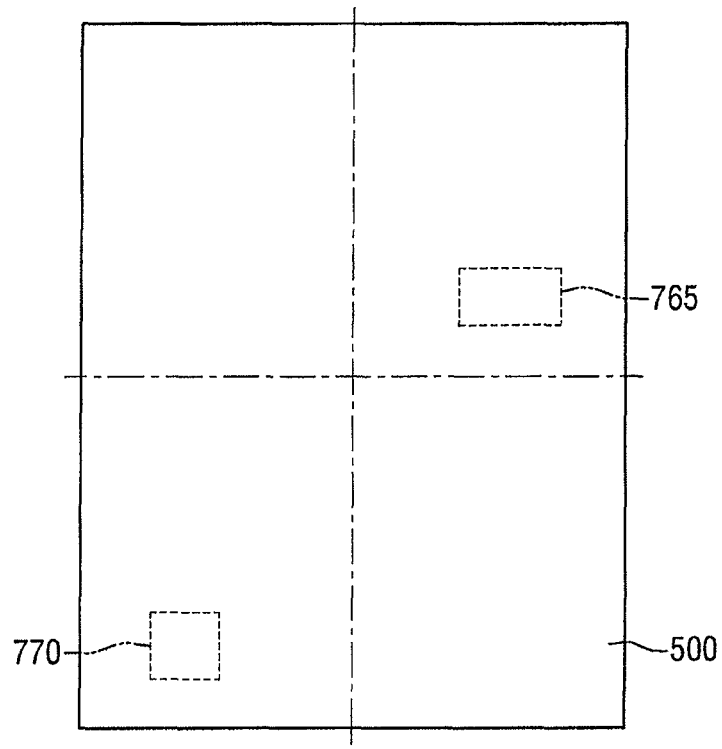

Referring to FIG. 7, the organic light-emitting display device 1070 includes two grooves 765 and 770, and the grooves 765 and 770 are arranged asymmetrical to each other with respect to a center line. The groove 765 above a horizontal center line of a frame 500 is located on a right side of the frame 500, whereas the other groove 770 is located on a lower left side of the frame 500. The groove 765 located on the upper right side of the frame 500 is rectangular, and the groove 770 located on the lower left side of the frame 500 is square. In this structure, the grooves 765 and 770 are arranged substantially asymmetrical to each other. Accordingly, the alignment direction and margin of the frame 500 and a housing are determined, thus facilitating an alignment process.

Figure 8:
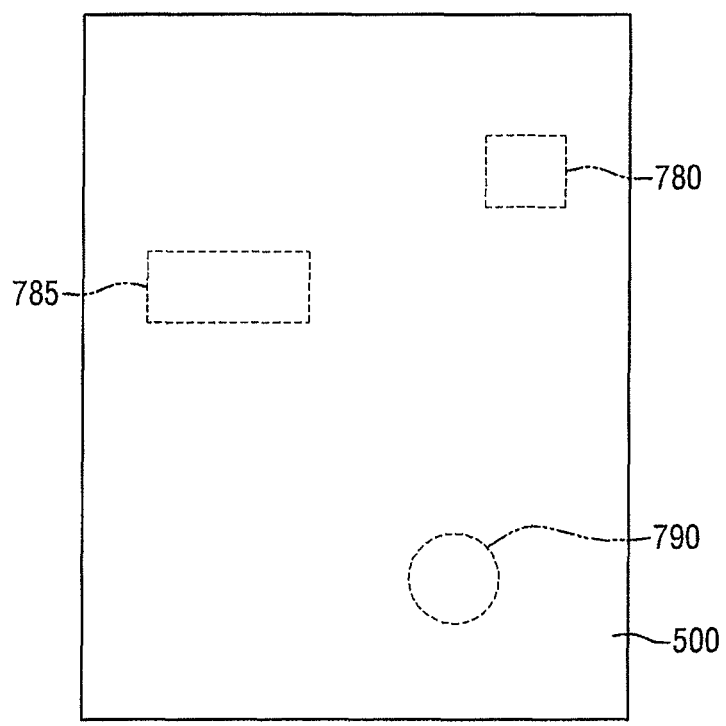

Referring to FIG. 8, the organic light-emitting display device 1080 includes three grooves 780, 785 and 790. The grooves 780, 785 and 790 are arranged asymmetrical to each other with respect to a center line. The groove 780 located near an upper right corner of a frame 500 may be square, the groove 785 located on a middle left side of the frame 500 may be bar-shaped, and the other groove 790 located near a lower right corner of the frame 500 may be circular. In this structure, the grooves 780, 785 and 790 are arranged substantially asymmetrical to each other. Accordingly, the alignment direction and margin of the frame 500 and a housing are determined, thus facilitating an alignment process.

Figure 9:
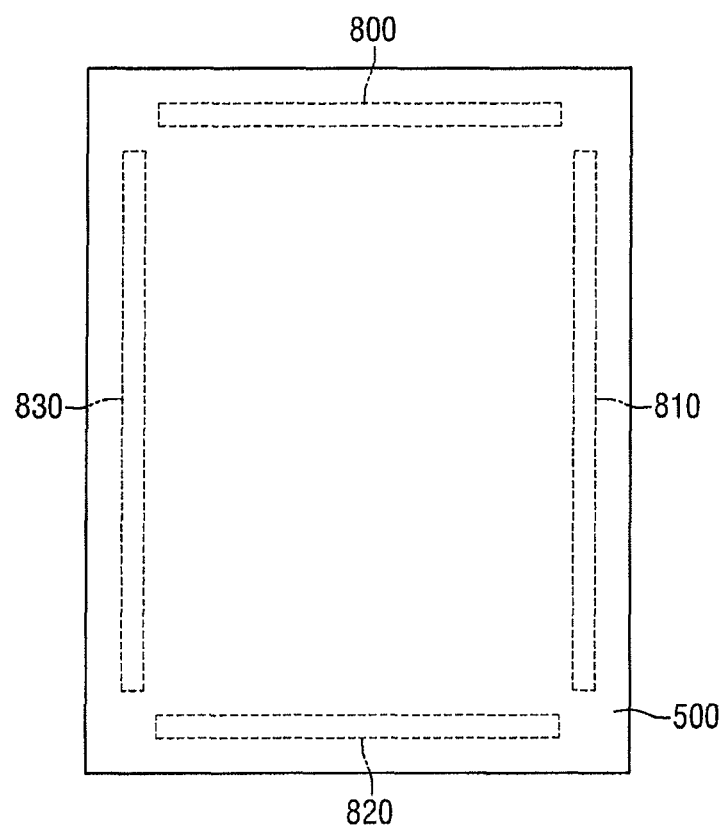

Referring to FIG. 9, the organic light-emitting display device 1090 includes four grooves 800 through 830, and the four grooves 800 through 830 may be located near edges of a frame 500, respectively. Each of the grooves 800 through 830 may be shaped like a bar which extends substantially parallel to a corresponding edge of the frame 500. This structure defines upper, lower, right and left sides of the frame 500. Accordingly, the alignment direction and margin of the frame 500 and a housing are determined, thus facilitating an alignment process.

Referring back to FIG. 1, the organic light-emitting display device 1000 may further include a coupling member 600 which couples the frame 500 and the housing 400 to each other. To be coupled to the coupling member 600, the frame 500 and the housing 400 may include first and second resting portions 1200 and 1250, respectively.

More specifically, the sidewall 530 of the frame 500 includes the first horizontal resting portion 1200 substantially parallel to the bottom portion 990 of the frame 500. The sidewall 530 of the frame 500 may be divided into the first sidewall 510 and a second sidewall 525 by the first resting portion 1200. In addition, the housing 400 may include the sidewall 410 extending upward from the bottom portion 900 thereof. In FIG. 1, the sidewall 410 extends upward from the bottom portion 900 in the direction perpendicular to the bottom portion 900. The sidewall 410 of the housing 400 includes the second horizontal resting portion 1250 substantially parallel to the bottom portion 900.

That is, the coupling member 600 rests on the first resting portion 1200 and the second resting portion 1250 and couples the frame 500 and the housing 400 to each other. In some embodiments, the coupling member 600 may be, but is not limited to, sponge coated with an adhesive material.

The organic light-emitting display device 1000 may further include an impact absorbing member 300 interposed between the housing 400 and the display panel 200. The impact absorbing member 300 may absorb external impact caused by the falling of the display device 1000 to prevent the external impact from being delivered to the display panel 200. The impact absorbing member 300 may be, not is not limited to, a cushion-type elastic member such as urethane.

The organic light-emitting display device 1000 may further include a touch panel 100 disposed above the display panel 200. The touch panel 100 may include an external window 110, a touch screen panel 130, and a bonding portion 120 which bonds the external window 110 and the touch screen panel 130 together. The touch panel 100 is disposed on the coupling member 600 and may be attached to the coupling member 600 by the adhesive material of the coupling member 600.

The external window 110 is located on the exterior of the display device 1000 and easily exposed due to its position. Therefore, the external window 110 may be made of a material which is not easily contaminated with contaminants or is highly resistant to external impact. In addition, the external window 110 may be made of a material transparent enough to allow an image displayed on the touch screen panel 130 to be clearly visible.

The touch screen panel 130 may be an input unit used to issue certain commands to a central processing unit (CPU) by simply touching the touch screen panel 130 using a finger or a pen or by drawing characters or pictures.

The bonding portion 120 which is an optical clear adhesive (OCA) may be a fluorine release film that bonds the external window 110 and the touch screen panel 130 together. The external window 110 and the touch screen panel 130 may be bonded together using the OCA (i.e., the bonding portion 120) in a laminating process.

Figure 10:
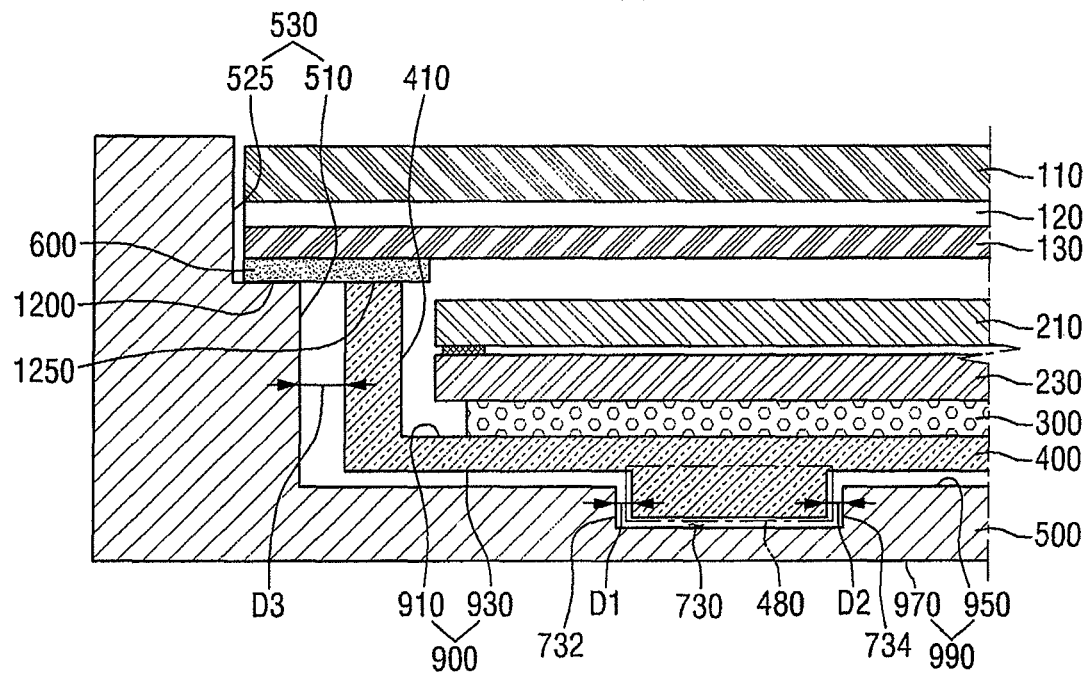
FIGS. 10 through 13 are cross-sectional views of organic light-emitting display devices according to other embodiments.

FIG. 10 is a cross-sectional view of an organic light-emitting display device 1020 according to another embodiment.

Referring to FIG. 10, the organic light-emitting display device 1020 according to the current embodiment is different from the organic light-emitting display device 1000 according to the FIG. 2 embodiment in that an impact relieving member is omitted and that a housing 400 includes a protruding portion 480 protruding toward a frame 500 and at least partially inserted into a groove 730 of the frame 500.

More specifically, the housing 400 may include a bottom portion 900, and the bottom portion 900 may include a bottom surface 910 (i.e., an upper surface) and a base surface 930 (i.e., a lower surface). Here, the housing 400 may include the protruding portion 480 which protrudes from the base surface 930 toward the frame 500 and is at least partially inserted into the groove 730 of the frame 500.

The protruding portion 480 may be separated from inner sidewalls 732 and 734 of the groove 730 by a predetermined gap. A first shortest horizontal gap D1 or D2 between the inner sidewalls 732 and 734 of the groove 730 and the protruding portion 480 may be smaller than a second shortest horizontal gap D3 between a sidewall 510 of the frame 500 and a sidewall 410 of the housing 400. If the first shortest horizontal gap D1 or D2 is smaller than the second shortest horizontal gap D3, even when the frame 500 is moved in a substantially horizontal direction by the force of external impact, the inner sidewall 732 of the groove 730 of the frame 500 catches on the protruding portion 480 before the sidewall 510 of the frame 500 reaches the sidewall 410 of the housing 400. Accordingly, since the direct delivery of impact from the sidewall 510 of the frame 500 to the sidewall 410 of the housing 400 is prevented or at least suppressed, the damage to a display panel 200 housed in the housing 400 can be prevented.

Figure 11:
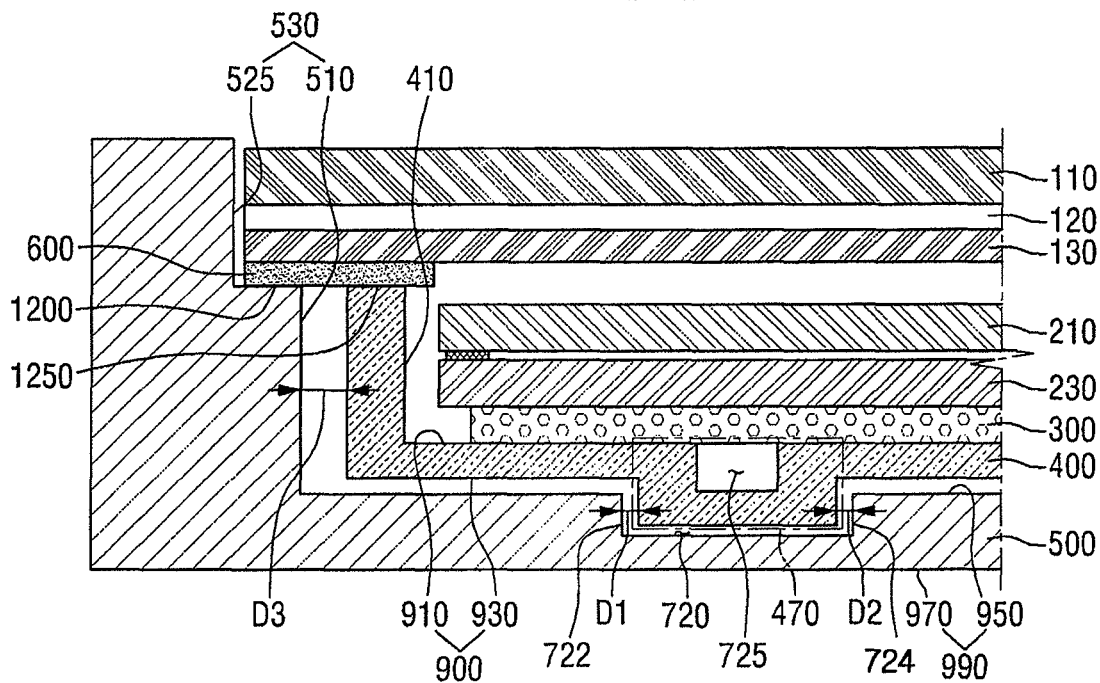

FIG. 11 is a cross-sectional view of an organic light-emitting display device 1030 according to another embodiment.

Referring to FIG. 11, as in the organic light-emitting display device 1020 according to the FIG. 10 embodiment, in the organic light-emitting display device 1030 according to the current embodiment, an impact relieving member is omitted. Instead, a housing 400 may include a protruding portion 470 which protrudes toward a frame 500 and is at least partially inserted into a groove 720 of the frame 500.

The current embodiment is different from the FIG. 10 embodiment in that the housing 400 includes a groove 725 recessed from a bottom surface 910 at a position corresponding to that of the protruding portion 470. In some embodiments, the presence of the recessed groove 725 may cause a cross section of the protruding portion 470 to be 'U'-shaped.

The protruding portion 470 may be separated from inner sidewalls 722 and 724 of the groove 720 by a predetermined gap. A first shortest horizontal gap D1 or D2 between the inner sidewalls 722 and 724 of the groove 720 and the protruding portion 470 may be smaller than a second shortest horizontal gap D3 between a sidewall 510 of the frame 500 and a sidewall 410 of the housing 400. If the first shortest horizontal gap D1 or D2 is smaller than the second shortest horizontal gap D3, even when the frame 500 is moved in a substantially horizontal direction by the force of external impact, the inner sidewall 722 of the groove 720 of the frame 500 catches on the protruding portion 470 before the sidewall 510 of the frame 500 reaches the sidewall 410 of the housing 400. Accordingly, the further movement of the frame 500 is prevented or at least suppressed.

Figure 12:
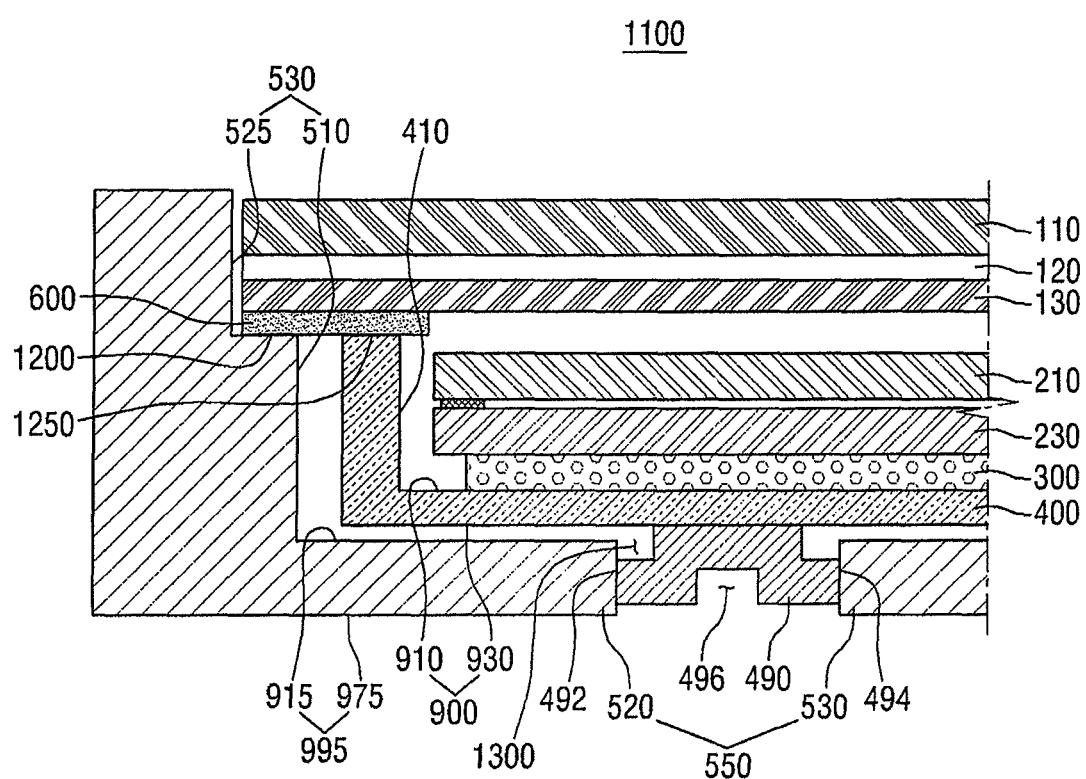

FIG. 12 is a cross-sectional view of an organic light-emitting display device 1100 according to another embodiment.

Referring to FIG. 12, the organic light-emitting display device 1100 according to the current embodiment, unlike those according to the above embodiments, includes a frame 550 having a through hole 1300. In addition, the frame 550 includes a bottom portion 995, and the bottom portion 995 includes a base surface 975 (i.e., a lower surface) and a bottom surface 915 (i.e., an upper surface). The frame 550 includes the through hole 1300 that goes through the frame 550 from the bottom surface 915.

In the drawing, the through hole 1300 of the frame 500 includes inner sidewalls 492 and 494, and an impact relieving member 490 is inserted between a left frame 520 and a right frame 530. More specifically, an upper end of the impact relieving member 490 may be attached to a base surface 930 of a housing 400, and sides of the impact relieving member 490 may be attached to the inner sidewalls 492 and 494 of the through hole 1300. In addition, a lower end of the impact relieving member 490 may include a recessed groove 496.

The impact relieving member 490 attached to the frame 550 and the housing 400 as described above can prevent the housing 400 and a display panel 200 from moving in a vertical direction. Moreover, since the impact relieving member 490 absorbs external impact, the impact is not or hardly delivered to the display panel 200 in a horizontal direction. Thus, the display device 1100 with secured mechanical strength can be provided.

FIG. 13 is a cross-sectional view of an organic light-emitting display device 1200 according to another embodiment.

Referring to FIG. 13, the organic light-emitting display device 1200 according to the current embodiment includes a frame 550 having a through hole 1300. However, the current embodiment is different from the FIG. 12 embodiment in that sides 1410 and 1420 of an impact relieving member 1400 do not contact inner sidewalls 492 and 494 of the frame 550.

A first shortest horizontal gap D1 or D2 between the inner sidewalls 492 and 494 of the frame 550 and the sides 1410 and 1420 of the impact relieving member 1400 may be smaller than a second shortest horizontal gap D3 between a sidewall 560 of the frame 550 and a sidewall 410 of a housing 400. If the first shortest horizontal gap D1 or D2 is smaller than the second shortest horizontal gap D3, even when the frame 550 is moved in a horizontal direction by the force of external impact, the inner sidewalls 492 and 494 of the frame 550 catch on the sides 1410 and 1420 of the impact relieving member 1400 before the sidewall 560 of the frame 550 reaches the sidewall 410 of the housing 400. Accordingly, the further movement of the frame 550 is prevented or at least suppressed.

In some embodiments, a display portion may include a liquid crystal display portion (not shown) instead of an organic light-emitting portion. The liquid crystal display portion may include a color filter substrate and a TFT substrate, and a liquid crystal layer may be interposed between the two substrates. Additionally, a backlight unit (BLU) (i.e., a light source) which emits light from behind a substrate may further be provided.

The present invention will now be described in further detail with reference to the following experimental example. Information not provided below can be readily inferred by those of ordinary skill in the art, and thus a description thereof will be omitted.

Experimental example: Adhesion of an impact relieving member to a housing according to embodiments.

An adhesive force (a shear force) of an impact relieving member according to an embodiment was measured. The adhesive force of the impact relieving member indicates the capability of the impact relieving member to withstand external impact. A housing having the impact relieving member attached thereto was fixed to a jig, and then the adhesive force of the impact relieving member was measured by applying a force to the impact relieving member in a direction. The number of samples was 20 EA. A value of 800 N or more was determined to indicate a good adhesive force, and a value of 1000 N or more was determined to indicate a very good adhesive force.

TABLE 1

| Sample | Shear (N) |
|---|---|
| 1 | 998.27 |
| 2 | 1012.98 |
| 3 | 1199.17 |
| 4 | 1032.40 |
| 5 | 1047.51 |
| 6 | 1091.17 |
| 7 | 1012.78 |
| 8 | 1066.15 |
| 9 | 1016.12 |
| 10 | 1052.22 |
| 11 | 1100.98 |
| 12 | 1120.69 |
| 13 | 1030.05 |
| 14 | 873.09 |
| 15 | 1022.79 |
| 16 | 1068.70 |
| 17 | 1033.58 |
| 18 | 1047.51 |
| 19 | 1071.84 |
| 20 | 1001.90 |
| MAX | 1199.17 |

As apparent from the above experimental results, first and fourteenth samples had a shear force of less than 1000 N, whereas all the other samples had a shear force of 800 N or more. All of the other eighteen samples had a shear force of 1000 N or more. It can be understood from these experimental results that the other eighteen samples had a good or very good adhesive force (shear force).

In display devices according to embodiments, external impact is not or hardly delivered to a display panel. Thus, the damage to the display panel due to the external impact can be reduced.

In concluding the detailed description, those skilled in the art will appreciate that many variations and modifications can be made to the disclosed embodiments. Therefore, the disclosed embodiments are used in a generic and descriptive sense only and not for purposes of limitation.

What is claimed is:

1. A display device comprising:
   a display panel;
   a housing for the display panel; and
   a frame comprising a first bottom portion, wherein the housing is interposed between the display panel and the frame,
   wherein the first bottom portion comprises a first lower surface and a first upper surface opposing each other, wherein the first upper surface is closer to the housing than the first lower surface, and wherein at least one groove is formed in the first upper surface,
   wherein the housing comprises a second bottom portion which accommodates the display panel, wherein the second bottom portion comprises a second upper surface and a second lower surface opposing each other, wherein the second upper surface is closer to the display panel than the second lower surface, wherein the housing comprises a protruding portion which protrudes from the second lower surface toward the frame and is at least partially inserted into the groove of the frame, wherein the protruding portion extends in the depth dimension of the display panel, and wherein the groove overlaps the protruding portion in the depth dimension of the display panel.

2. The display device of claim 1, wherein the frame comprises a sidewall which extends from the first bottom portion so as to partially surround a side portion of the display panel, wherein the groove of the frame comprises inner sidewalls, and wherein the shortest distance between the inner sidewalls of the groove and the protruding portion is smaller than the shortest distance between the sidewall of the frame and the housing.

3. The display device of claim 1, wherein a groove is formed in the second upper surface at a position corresponding to that of the protruding portion.

4. The display device of claim 1, wherein the groove has a bottom surface, and wherein the protruding portion does not contact the bottom surface of the groove.

5. A display device comprising:
   a display panel;
   a housing for the display panel;
   a frame comprising a bottom portion that has one or more through holes, wherein the housing is interposed between the display panel and frame; and
   an impact relieving member which is at least partially inserted into each of the through holes of the frame, and wherein the through holes overlap the impact relieving member in the depth dimension of the display panel.

6. The display device of claim 5, wherein the frame comprises a sidewall which extends from the bottom portion so as to partially surround a side portion of the display panel, wherein each of the through holes of the frame comprises inner sidewalls, wherein an upper end of the impact relieving member is attached to the housing, and wherein the shortest distance between the inner sidewalls of each of the through holes and the impact relieving member is smaller than the shortest distance between the sidewall of the frame and the housing.

7. The display device of claim 5, wherein the frame comprises a sidewall which extends from the bottom portion so as to partially surround a side portion of the display panel, wherein each of the through holes of the frame comprises inner sidewalls, wherein an upper end of the impact relieving member is attached to the housing, and wherein sides of the impact relieving member are attached to the inner sidewalls of each of the through holes.

8. The display device of claim 7, wherein a groove is formed in a lower end of the impact reliving member.

9. The display device of claim 5, wherein a gap is formed between an inner sidewall of each of the through holes and the impact relieving member.

* * * * *